United States Patent [19]

Irving et al.

[11] 3,977,015

[45] Aug. 24, 1976

[54] SILVER, GALLIUM, AND OXYGEN CONTACT FOR INDIUM PHOSPHIDE

[75] Inventors: Leonard David Irving; James Edward Pattison, both of Malvern; Huw David Rees, Malvern Link, all of England

[73] Assignee: British Secretary of State for Defence, London, England

[22] Filed: Mar. 31, 1975

[21] Appl. No.: 563,432

[30] Foreign Application Priority Data

Mar. 29, 1974 United Kingdom............... 14166/74

[52] U.S. Cl........................................ 357/3; 357/67
[51] Int. Cl.².................. H01L 29/46; H01L 47/00
[58] Field of Search.................................. 357/3, 67

[56] References Cited
UNITED STATES PATENTS

| | | |
|---|---|---|
| 3,544,854 | 12/1970 | Cox et al. ............................. 357/67 |
| 3,667,003 | 5/1972 | Hilsum et al........................... 357/3 |
| 3,745,071 | 7/1973 | Mitsui..................................... 357/3 |
| 3,767,482 | 10/1973 | Kock et al. ........................... 357/67 |

Primary Examiner—William D. Larkins
Attorney, Agent, or Firm—Elliott I. Pollock

[57] ABSTRACT

A semiconductor transferred electron device of the kind which includes indium phosphide as a major constituent is provided with a cathode consisting of oxidized silver gallium. The cathode preferably contains 4 times more silver than gallium by weight, and the oxygen content is preferably from 2 to 20 atomic per cent of the gallium content of the cathode. This improved device provides high electrical to microwave conversion efficiencies for a high proportion of devices produced together in any given batch.

6 Claims, 1 Drawing Figure

U.S. Patent   Aug. 24, 1976   3,977,015
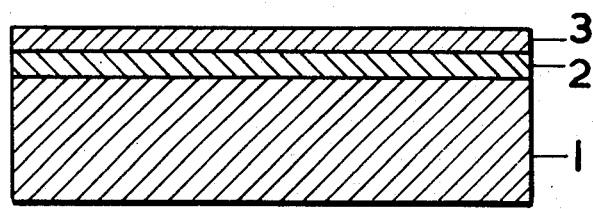

SILVER, GALLIUM, AND OXYGEN CONTACT FOR INDIUM PHOSPHIDE

The present invention relates to transferred electron devices, particularly those made from semiconductor material containing indium phosphide as a major constitutent.

Transferred electron devices such as Gunn diodes are semiconductor devices which in recent years have been used in a variety of applications as microwave generators. They comprise a piece or region of n-type semiconductor material having an appropriate energy band structure, which material is hereinafter referred to as the "active material", and two electrodes, the anode and the cathode, attached to the active material for the purpose of applying a high electric field across the active material. Transferred electron devices operate by the transferred electron effect by which the state of electrons in the active material is transferred from a conduction band region of low energy and high mobility to one or more conduction band regions of high energy and low mobility by the application of a high electric field: electrical instabilities in the active material result, and these can be converted into electromagnetic microwaves in a conventional microwave cavity. Examples of transferred electron devices are described in United Kingdom patent specifications Nos. 1,205,211, 1,286,674 and 1,354,511. In the last mentioned specification the advantage of making transferred electron devices from a semiconductor material containing indium phosphide as a major constituent is also discussed.

Although reasonably high efficiencies have been obtained from individual prior art transferred electron devices the efficiency is not usually repeated throughout a given batch of the devices produced together.

Accordingly, it is an object of the invention to produce a transferred electron device which provides a high efficiency which is repeated throughout a number of samples in any given batch.

According to the present invention a transferred electron device which incorporates as its active material a semiconductor containing indium phosphide as its major constituent includes a cathode comprising a region of an oxidized alloy of silver and gallium containing more silver than gallium. The anode may be made in a conventional way.

Preferably the oxygen content of the cathode is between 2 and 20, typically 10, atomic per cent of the gallium content of the cathode.

The active material may for example be n-type indium phosphide or an n-type alloy of indium phosphide and indium arsenide containing more than about 75% indium phosphide.

The cathode may be formed in one of the following ways:
a. by heating silver in an atmosphere of air or oxygen prior to alloying it with gallium on the active material;
b. by heating the gallium in an atmosphere or air of oxygen prior to alloying it with silver on the active material;
c. by heating the gallium with digallium trioxide $Ga_2O_3$ prior to alloying it with silver on the active material;
d. by heating silver and gallium together in an atmosphere of air or oxygen prior to alloying them on the active material;
e. by heating silver and gallium with $Ga_2O_3$ prior to alloying them together or the active material; or
f. by oxidizing the surface of the active material prior to alloying silver and gallium on that surface.

It has now been discovered that if a batch of transferred electron devices are made according to the invention and are used as microwave sources an unexpectedly high efficiency for the conversion of electrical power into microwave power can be obtained for a large proportion of the devices in the batch.

Embodiments of the present invention will now be described by way of example with reference to the accompanying drawing, which is a cross-sectional diagram of a transferred electron device embodying the invention.

A substrate 1 consists of a conventional slice of n indium phosphide. The substrate 1 acts as an anode for the device and also as a physical support and heat sink for the device. An epitaxial layer 2 of n-type indium phosphide is deposited in a known way, for example from a reaction of indium and phosphorus trichloride, on the substrate 1. The layer 2, which has a thickness typically of about 10 $\mu$m and a carrier concentration typically of about $10^{15}cm^{-3}$, acts as the active material of the device. A layer 3 of an oxidized alloy of silver and gallium containing more silver than gallium is deposited on the layer 3 as described below. The layer 3 acts as the cathode of the device.

If an electric field of above about 10 kV per cm is applied across the active layer 2 by biassing the substrate 1 positively and the layer 3 negatively, then the layer 2 undergoes electrical instabilities as described above. The instabilities may be coupled out to an external circuit (not shown) by a conventional microwave cavity in which the device is located.

United Kingdom patent specification No. 1,386,967 describes examples of transferred electron devices arranged in microwave cavities and also describes how such devices may be encapsulated for use in such an arrangement.

The layer 3 in the device illustrated may be made in one of the following ways.

As a first example, gallium is heated in an atmosphere of oxygen in a closed tube at a temperature of about 600°C. The resultant oxidized gallium is subsequently evaporated together with silver onto the substrate 1, by passing an electric current through a metal spatula containing oxidized gallium and silver in the same weight proportions as required in the final alloy in an evacuated bell-jar in which the substrate 1 is located above the spatula. Finally, the oxidized gallium and silver are alloyed together and fused into the surface of the substrate 1 by reheating the substrate 1 in an atmosphere of hydrogen at about 400°C.

As a second example, a mixture of gallium and di-gallium trioxide $Ga_2O_3$ containing about 10 atomic % oxygen is heated in a closed tube. The resultant oxidized gallium is then evaporated with silver and alloyed as described in the first example.

As a third example, silver and gallium in the correct weight proportions for the final alloy are heated by passing an electric current through a metal spatula containing them at a temperature of about 650°C and a pressure of about 0.1 torr to oxidize the silver-gallium mixture. The mixture is then evaporated onto the substrate 1 and alloyed as described in the first example.

As a fourth example, the surface of the substrate 1 is oxidized by immersing it in a solution of hydrogen peroxide. After oxidization of the surface, silver and gallium are evaporated, alloyed and fused to the surface as described in the first example above.

In the above examples the weight ratio of silver to gallium used in the starting material for the evaporation and subsequent alloying may for example be 4 to 1.

Devices embodying the invention and having for the cathode material a silver to gallium weight ratio of 4 to 1 have been operated as microwave sources at 11 to 15 GHz and a large proportion of these have been shown to exhibit high electrical to microwave power conversion efficiencies; an average efficiency of 14.5% has been obtained for a sample of 50 devices tested together.

We claim:

1. A transferred electron device comprising an active material formed of a semiconductor whose major constituent is indium phosphide, a cathode in electrical contact with said active material and an anode in electrical contact with said active material, said cathode comprising a region of an oxidized alloy of silver and gallium containing more silver than gallium, the oxygen content of said cathode being between 2 and 20 atomic percent of the gallium content of said cathode.

2. A transferred electron device as claimed in claim 1 wherein said cathode contains about four times more silver than gallium by weight.

3. A transferred electron device as claimed in claim 1 wherein the oxygen content of said cathode is about 10 atomic per cent of the gallium content of said cathode.

4. A transferred electron device as claimed in claim 1 wherein said active material is $n$-type indium phosphide.

5. A transferred electron device as claimed in claim 1, wherein said active material is $n$-type in $As_xP_{1-x}$, where $0 \leq x \leq 0.25$.

6. A transferred electron device as claimed in claim 1 wherein said anode is an $n^+$ substrate, said active material is an epitaxial layer on said substrate and said cathode is a metallic layer deposited on said epitaxial layer.

* * * * *

UNITED STATES PATENT AND TRADEMARK OFFICE
CERTIFICATE OF CORRECTION

PATENT NO. : 3,977,015
DATED : August 24, 1976
INVENTOR(S) : Leonard David Irving; James Edward Pattison; and Huw David Rees It is certified that error appears in the above-identified patent and that said Letters Patent are hereby corrected as shown below:

Please correct the assignee to read:

-- the Secretary of State for Defence in Her Britannic Majesty's Government of the United Kingdom of Great Britain and Northern Ireland, London, England --

Signed and Sealed this

Fourteenth Day of December 1976

[SEAL]

Attest:

RUTH C. MASON
*Attesting Officer*

C. MARSHALL DANN
*Commissioner of Patents and Trademarks*